(12) United States Patent
Lee

(10) Patent No.: US 9,412,464 B2
(45) Date of Patent: Aug. 9, 2016

(54) SEMICONDUCTOR MEMORY DEVICE AND MEMORY MODULE HAVING RECONFIGURATION REJECTING FUNCTION

(71) Applicant: SAMSUNG ELECTRONICS CO., LTD., Suwon-Si, Gyeonggi-Do (KR)

(72) Inventor: Young Duk Lee, Asan-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/642,974

(22) Filed: Mar. 10, 2015

(65) Prior Publication Data

US 2016/0055920 A1  Feb. 25, 2016

(30) Foreign Application Priority Data

Aug. 19, 2014  (KR) .................. 10-2014-0107756

(51) Int. Cl.
| | |
|---|---|
| *G11C 29/14* | (2006.01) |
| *G11C 17/18* | (2006.01) |
| *G11C 17/16* | (2006.01) |
| *G11C 29/04* | (2006.01) |
| *G11C 29/00* | (2006.01) |
| *G11C 29/12* | (2006.01) |
| *G11C 7/10* | (2006.01) |

(52) U.S. Cl.
CPC .............. *G11C 17/18* (2013.01); *G11C 17/16* (2013.01); *G11C 29/04* (2013.01); *G11C 29/12* (2013.01); *G11C 29/14* (2013.01); *G11C 29/70* (2013.01); *G11C 7/1054* (2013.01); *G11C 7/1081* (2013.01)

(58) Field of Classification Search
CPC ......... G11C 29/04; G11C 29/12; G11C 29/14
USPC ..................................................... 365/201, 96
See application file for complete search history.

(56) References Cited

U.S. PATENT DOCUMENTS

| | | | |
|---|---|---|---|
| 5,793,692 A | 8/1998 | Merritt et al. | |
| 6,408,411 B1 * | 6/2002 | Brown ............. | G11C 29/40 |
| | | | 365/201 |
| 6,940,765 B2 | 9/2005 | Kyung | |
| 7,284,166 B2 | 10/2007 | Zappa et al. | |
| 7,336,550 B2 | 2/2008 | Lee | |
| 7,415,640 B1 | 8/2008 | Zorian et al. | |
| 7,468,922 B2 | 12/2008 | Callaway et al. | |
| 7,539,590 B2 | 5/2009 | Behera et al. | |
| 7,546,506 B2 | 6/2009 | Sonoda et al. | |
| 7,627,792 B2 | 12/2009 | Di Ronza et al. | |
| 7,746,712 B2 | 6/2010 | Kang et al. | |
| 8,134,880 B2 | 3/2012 | Anzou et al. | |
| 8,295,108 B2 | 10/2012 | Darbinyan et al. | |
| 8,570,820 B2 | 10/2013 | Gorman et al. | |
| 8,687,444 B2 | 4/2014 | Ide et al. | |
| 2008/0282107 A1 | 11/2008 | Hung et al. | |
| 2009/0125762 A1 | 5/2009 | Wang | |
| 2010/0005376 A1 | 1/2010 | Laberge et al. | |

FOREIGN PATENT DOCUMENTS

| | | |
|---|---|---|
| KR | 0505702 | 7/2005 |
| KR | 20080090664 A | 10/2008 |

\* cited by examiner

*Primary Examiner* — Huan Hoang
*Assistant Examiner* — Jay Radke
(74) *Attorney, Agent, or Firm* — Volentine & Whitt, PLLC

(57) ABSTRACT

A semiconductor memory device and a memory module have a reconfiguration preventing function. The semiconductor memory device may include a memory cell array, a test information storing unit, and a control unit. The control unit may include a control signal storing unit and may prevent programming of the test information storing unit according to a control signal stored in the control signal storing unit.

20 Claims, 13 Drawing Sheets

SEMICONDUCTOR MEMORY DEVICE AND MEMORY MODULE HAVING RECONFIGURATION REJECTING FUNCTION

CROSS-REFERENCE TO RELATED APPLICATION

This application claims the benefit of Korean Patent Application No. 10-2014-0107756, filed on Aug. 19, 2014, in the Korean Intellectual Property Office, the disclosure of which is incorporated herein in its entirety by reference.

BACKGROUND

The inventive concept relates to a semiconductor memory device, and more particularly, to a semiconductor memory device and a memory module having a reconfiguration prevention function.

With the development of semiconductor manufacturing technologies, the size of data capable of being stored in a semiconductor memory device has significantly increased. In addition, as sizes of transistors or lines included in a semiconductor memory device have been gradually reduced, it is highly likely that defects will occur during a semiconductor manufacturing process. For example, if shorted or opened word lines and defective transistors occur in a memory cell array of a semiconductor memory device, it may become difficult to normally write, read, or retain data.

A semiconductor memory device may include an element that repairs defects occurring during a semiconductor manufacturing process. For example, a semiconductor memory device may include an element that replaces a region having a defect with another element in a memory cell array. In addition, a semiconductor memory device may include an element that compensates for an individual characteristic of a semiconductor memory device, which may be caused by a deviation in a semiconductor manufacturing process. Such repairing elements may be operated based on information acquired during an operation of testing a semiconductor memory device.

SUMMARY

The inventive concept provides a reconfigurable semiconductor memory device and a memory module including the same, and provides a semiconductor memory device and a memory module that are capable of selectively setting an execution of a reconfiguration operation.

According to an aspect of the inventive concept, there is provided a semiconductor memory device including: a memory cell array that includes a plurality of memory cells; a test information storing unit configured to store test information in a non-volatile manner, based on test results of the plurality of memory cells; and a control unit that includes a control signal storing unit and is configured to prevent programming of the test information storing unit based on a control signal stored in the control signal storing unit.

The control unit may generate a first control signal upon reception of a first command, store the first control signal in the control signal storing unit, and prevent the programming of the test information storing unit according to the stored first control signal upon reception of a second command.

The control signal storing unit may include a one time programmable (OTP) device, and the stored first control signal may correspond to a state in which the OTP device is programmed.

The control unit may further include: a verification unit configured to verify data stored in the memory cell array upon reception of a third command; a verification result storing unit configured to store a verification result of the verification unit; and a decision unit configured to decide whether to store the first control signal in the control signal storing unit based on one or more verification results stored in the verification result storing unit.

The decision unit may store the first control signal in the control signal storing unit when the number of results corresponding to a failure among the one or more verification results is larger than a reference value.

The verification result storing unit may include a fail address memory configured to store an address corresponding to a defect contained in the memory cell array.

The control unit may receive a command instructing an entry into a test mode and is configured to recognize the first and second commands in the test mode.

The test information storing unit may include an anti-fuse circuit.

The test information storing unit may store information for replacing a defect contained in the memory cell array.

The test information storing unit may store operation characteristic information of the semiconductor memory device, and the operation characteristic information may include timing information and/or voltage level information.

According to another aspect of the inventive concept, there is provided a memory module including: at least one semiconductor memory device; and a memory controller that includes a control signal storing unit and a test information storing unit configured to store test information in a non-volatile manner, based on a test result of the at least one semiconductor memory device, wherein the memory controller is configured to prevent programming of the test information storing unit based on a control signal stored in the control signal storing unit.

The memory controller may store a first control signal upon reception of a first command, store the first control signal in the control signal storing unit, and prevent programming of the test information storing unit according to the stored first control signal upon reception of a second command.

The control signal storing unit may include an OTP device, and the stored first control signal may correspond to a state in which the control signal storing unit is programmed.

The memory controller may further include: a verification unit configured to verify data stored in the semiconductor memory device upon reception of a third command; a verification result storing unit configured to store a verification result of the verification unit; and a decision unit configured to decide whether to store the first control signal in the control signal storing unit based on one or more verification results stored in the verification result storing unit.

The verification result storing unit may include a fail address memory configured to store an address corresponding to a defect contained in the semiconductor memory device.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
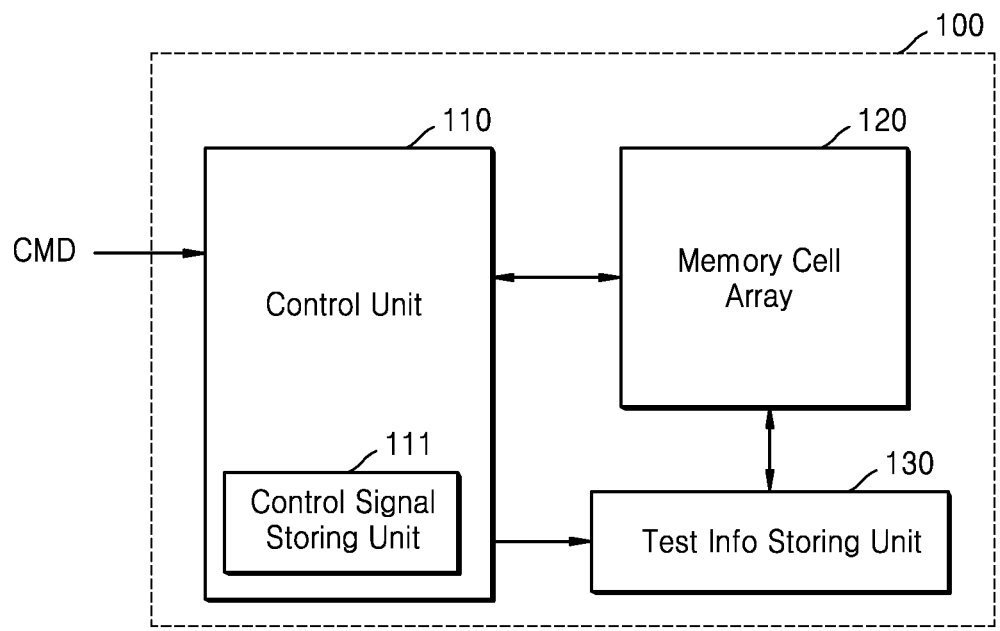
FIG. 1 is a block diagram of a semiconductor memory device according to an exemplary embodiment of the inventive concept.

Hereinafter, embodiments of the inventive concept will be described with reference to the accompanying drawings. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. Like reference numerals denote like elements throughout the specification and drawings. In the drawings, the dimensions of structures are exaggerated for clarity of the inventive concept. As used herein, the term "and/or" includes any and all combinations of one or more of the associated listed items.

The terms used in the present specification are merely used to describe particular embodiments, and are not intended to limit the inventive concept. As used herein, the singular forms "a", "an", and "the" are intended to include the plural forms as well, unless the context clearly indicates otherwise. It will be understood that the terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a semiconductor memory device 100 according to an exemplary embodiment of the inventive concept. The semiconductor memory device 100 may receive a command, an address, and data from another device (for example, a memory controller) provided outside the semiconductor memory device 100 and may transmit stored data to an external device in response to the received command. As illustrated in FIG. 1, the semiconductor memory device 100 may include a control unit 110, a memory cell array 120, and a test information storing unit 130. The semiconductor memory device 100 including the three elements is illustrated in FIG. 1, but this is only for illustrative purposes. For example, the semiconductor memory device 100 may further include power circuits, buffers that temporarily store an address and data received from the outside of the semiconductor memory device 100, and the like.

The control unit 110 may receive a command CMD from the outside of the semiconductor memory device 100 and control the elements of the semiconductor memory device 100, for example, the memory cell array 120 and the test information storing unit 130, in response to the received command CMD. According to an exemplary embodiment of the inventive concept, the control unit 110 may include a control signal storing unit 111. The control signal storing unit 111 may store a control signal in response to an electrical signal received by the control unit 110, for example, the command CMD, or may store a control signal based on a process applied to the semiconductor memory device 100, for example, an application of a laser beam. The control unit 110 may control the elements of the semiconductor memory device 100, for example, the test information storing unit 130, in response to the control signal stored in the control signal storing unit 111.

The memory cell array 120 may include a plurality of memory cells. The memory cell array 120 may store data received from the outside of the semiconductor memory device 100 or data generated by encoding the received data, and each of the memory cells may store at least one bit included in the data. The plurality of memory cells, which are included in the memory cell array 120, may be arranged in a matrix form and may be accessed through a plurality of word lines and a plurality of bit lines disposed in the memory cell array 120. The memory cell array 120 may include volatile memory cells, such as static random access memory (SRAM) cells or dynamic random access memory (DRAM) cells. In addition, the memory cell array 120 may include non-volatile memory cells, such as flash memory cells, magnetic random access memory (MRAM) cells, resistance RAM (RRAM) cells, ferroelectric RAM (FRAM) cells, or phase change memory (PCM) cells.

Only the memory cell array 120 is illustrated in FIG. 1 for conciseness, but the semiconductor memory device 100 may further include a row decoder and a column decoder so as to access the plurality of memory cells included in the memory cell array 120, and may further include a buffer that temporarily stores data to be written to the memory cell array 120 or temporarily stores data read from the memory cell array 120.

The test information storing unit 130 may store test information based on the test result of the semiconductor memory device 100. For example, the test information storing unit 130 may store information for replacing a defect contained in the memory cell array 120. The test information storing unit 130 may store information for replacing a region including the defect contained in the memory cell array 120 with another region of the memory cell array 120. The test information storing unit 130 may store address information of the region including the defect or address information of the replacing region.

According to an exemplary embodiment of the inventive concept, the test information storing unit 130 may store information associated with operation characteristics of the semiconductor memory device 100. The semiconductor memory device 100 may have distinct characteristics due to deviations in a manufacturing process or other factors. For example, an access time to the memory cell included in the memory cell array 120 is several ps and may vary according to the semiconductor memory device 100. In addition, a power supply voltage for driving the semiconductor memory device 100 is several mV and may vary according to the semiconductor memory device 100. Timing information and voltage level information may be obtained by testing the semiconductor memory device 100.

Figure 3:
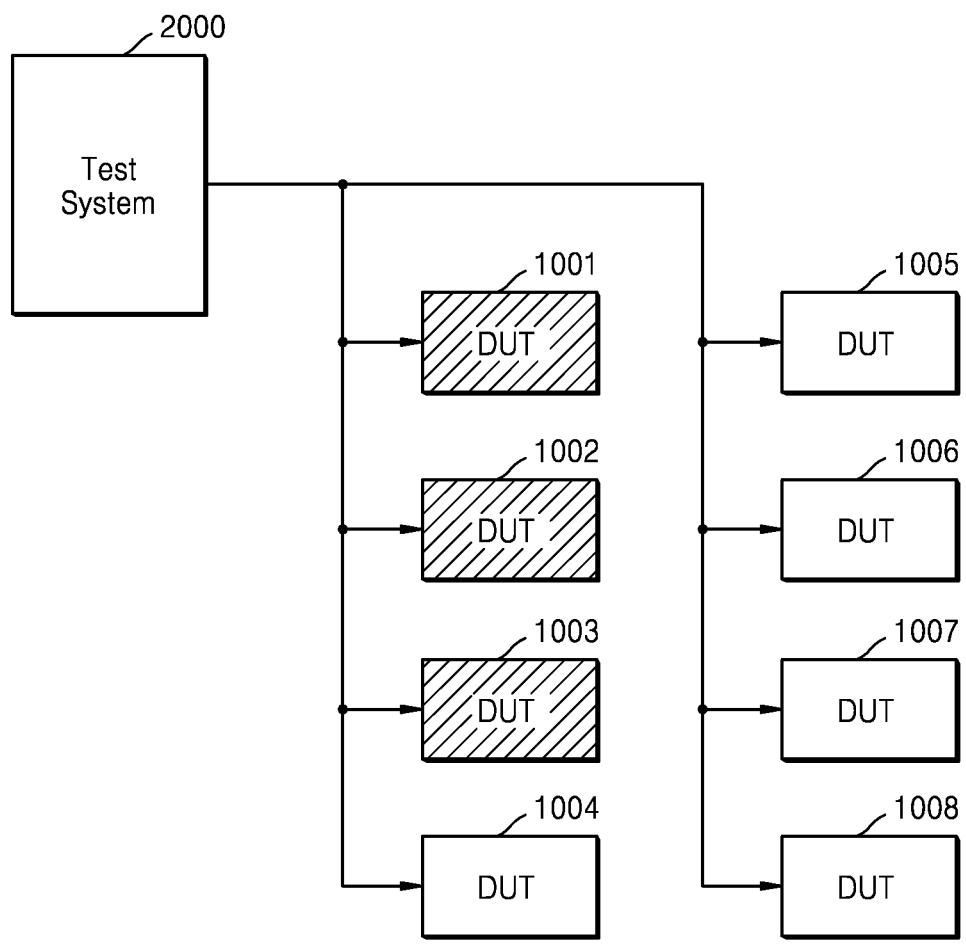
FIG. 3 is a diagram of an exemplary operation of testing a plurality of devices.

To obtain separate characteristic of the semiconductor memory device 100, the process of manufacturing the semiconductor memory device 100 may include testing the semiconductor memory device 100. Referring to FIG. 3, in a test operation, the semiconductor memory device 100 may be connected to a test system 2000, and the test system 2000 may test the semiconductor memory device 100 by transmitting a signal to the semiconductor memory device 100 or receiving a signal from the semiconductor memory device 100. In addition, the test system 2000 may transmit a command to the semiconductor memory device 100 so as to store test information in the test information storing unit 130, based on the test result of the semiconductor memory device 100. An operation of setting a device based on separate characteristic of a device (for example, the semiconductor memory device 100), which occurs during the manufacturing process, may be referred to as a reconfiguration operation or a reconfiguration-on-system (ROS). In particular, as one of reconfiguration operations, an operation of writing test information to a specific storage space (for example, the test information storing unit 130) included in a packaged semiconductor device (for example, the semiconductor memory device 100) or an operation of programming the storage space may be referred to as a post-package-repair (PPR).

The semiconductor memory device 100 may be controlled to operate in an adjusted or optimized condition based on the timing information and the voltage level information stored in the test information storing unit 130. For example, the semiconductor memory device 100 may generate a specific voltage from an external power supply voltage based on the voltage level information and supply the generated voltage to the elements of the semiconductor memory device 100. Due to the test information storing unit 130, it is less likely to classify the semiconductor memory device 100 as a defective device and it is possible to extend the lifetime of the semiconductor memory device 100.

According to an exemplary embodiment of the inventive concept, the test information storing unit 130 may include non-volatile memory cells. For example, the test information storing unit 130 may include rewritable non-volatile memory cells, such as flash memory cells, MRAM cells, RRAM cells, FRAM cells, or PCM cells, or may include one time programmable (OTP) type non-volatile memory cells, such as anti-fuse circuits. The non-volatile memory cells, which are included in the test information storing unit 130, retain information on the test information of the semiconductor memory device 100 even when power supplied to the semiconductor memory device 100 is cut off. Therefore, it is possible to ensure a normal operation of the semiconductor memory device 100. Due to a laser beam or an electrical signal, two nodes of the anti-fuse circuit may be electrically shorted (or, a state in which the anti-fuse circuit has a very low resistance) or may be electrically opened (or, a state in which the anti-fuse circuit has a very high resistance). In the following, the test information storing unit 130 is described as including the anti-fuse circuit, but it will be understood that the inventive concept is not limited thereto.

According to an exemplary embodiment of the inventive concept, the control unit 110 may control an operation of writing the test information in the test information storing unit 130, that is, an operation of programming the test information storing unit 130, in response to a received command CMD. In addition, the control unit 110 may selectively perform the operation of programming the test information storing unit 130 in response to the control signal stored in the control signal storing unit 111. That is, the control unit 110 may prevent the programming of the test information storing unit 130 according to whether the control signal is stored in the control signal storing unit 111. In this manner, the semiconductor memory device 100 may prevent the test information storing unit 130 from being programmed with arbitrary data due to an unintended external input signal, for example, a power noise. The control signal storing unit 111 may include volatile memory cells, such as SRAM cells or DRAM cells, or may include non-volatile memory cells, such as flash memory cells, MRAM cells, RRAM cells, FRAM cells, or PCM cells. In addition, the control signal storing unit 111 may include OTP type memory cells, such as anti-fuses.

Figure 2:
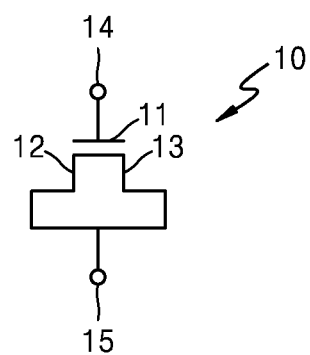
FIG. 2 is an exemplary configuration diagram of an anti-fuse circuit included in a test information storing unit of FIG. 1.

FIG. 2 is an exemplary configuration diagram of an anti-fuse circuit 10 included in the test information storing unit 130 of FIG. 1. The anti-fuse circuit 10 may include a depletion type MOS transistor, of which a source 12 and a drain 13 are connected to each other. In an initial state, a resistance between a first node 14 connected to a gate electrode 11 and a second node 15 commonly connected to the source 12 and the drain 13 may be very high because the first node 14 and the second node 15 are separated from each other by a gate oxide film. Therefore, a state between the first node 14 and the second node 15 may be an open state (or a very high resistance state).

The gate oxide film may be broken by applying a breakdown voltage between the first node 14 and the second node 15 of the anti-fuse circuit 10. Therefore, a state between the first node 14 and the second node 15 may irreversibly change from an open state to a closed state (or a very low resistance state). That is, when the gate oxide film is broken, a resistance between the first node 14 and the second node 15 may be reduced. According to an exemplary embodiment of the inventive concept, the test information storing unit 130 may include the anti-fuse circuit 10 as illustrated in FIG. 2, and the control signal storing unit 111 included in the control unit 110 also may include the anti-fuse circuit 10 so as to store the control signal.

FIG. 3 is a diagram of an exemplary operation of testing a plurality of devices 1001 to 1008. As illustrated in FIG. 3, the devices 1001 to 1008, which are being tested, may be referred to as devices under test (DUTs). According to an exemplary embodiment of the inventive concept, the DUTs 1001 to 1008 of FIG. 3 may be the semiconductor memory device of FIG. 1 or a memory module 200 of FIG. 6.

As illustrated in FIG. 3, the DUTs 1001 to 1008 may be electrically connected to the test system 2000. To reduce the time required for the test operation, the DUTs 1001 to 1008 may share one or more signal lines (for example, buses) connected to the test system 2000. Therefore, the DUTs 1001 to 1008 may be simultaneously tested by the test system 2000. That is, the DUTs 1001 to 1008 may simultaneously receive the same command from the test system 2000 and simultaneously perform the operations according to the received command. In addition, the DUTs 1001 to 1008 may share a power line through which the power is supplied from the test system 2000. The eight DUTs 1001 to 1008 are illustrated in FIG. 3, but this is only for illustrative purposes. Less than eight DUTs or more than eight DUTs may be connected to the test system 2000.

The test system 2000 may transmit the command for the reconfiguration operation to the DUTs 1001 to 1008, and the DUTs 1001 to 1008 may perform the reconfiguration operation according to the command received from the test system 2000. For example, the semiconductor memory device 100 of FIG. 1 may receive the command CMD from the test system 2000 and program the test information storing unit 130 in response to the received command CMD.

For some of the DUTs 1001 to 1008, the reconfiguration operation needs to be prevented. For example, the DUT 1001 may be mounted on a socket so as to electrically connect to the test system 2000, and a contact failure may occur between the socket and the DUT 1001. In addition, the DUT 1002 may contain a non-repairable defect, and the DUT 1003 may be in a state of being falsely tested due to an unexpected signal noise. In a case where the DUTs 1001, 1002, and 1003 perform the reconfiguration operation according to the command received from the test system 2000, the DUTs 1001, 1002, and 1003 may be set to an inappropriate condition. Hence, in a subsequent operation, repairing the DUTs 1001, 1002, and 1003 to normal DUTs or using as documents for DUT analysis may be prevented.

Although DUTs, of which the reconfiguration operation is required to be prevented, exist among the DUTs 1001 to 1008 connected to the test system 2000, it may be difficult for the test system 2000 to individually control the DUTs 1001 to 1008 because the DUTs 1001 to 1008 share the power line and the signal line with one another. Therefore, there is a need to individually control the reconfiguration operation with respect to the DUTs 1001 to 1008.

Figure 4:
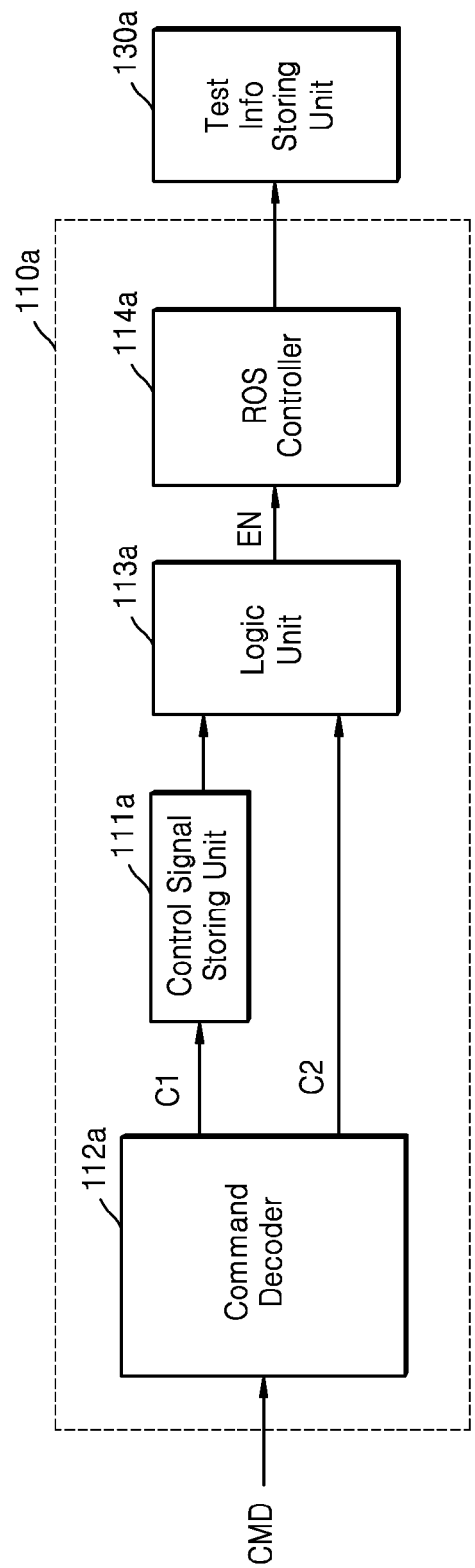
FIG. 4 is a block diagram illustrating an implementation example of the control unit included in the semiconductor memory device of FIG. 1, according to an exemplary embodiment of the inventive concept.

FIG. 4 is a block diagram illustrating an implementation example 110a of the control unit 110 included in the semiconductor memory device 100 of FIG. 1, according to an exemplary embodiment of the inventive concept. According to an exemplary embodiment of the inventive concept, the control unit 110a of FIG. 4 may receive a command CMD from a device (for example, a memory controller) disposed outside the semiconductor memory device 100 and program a test information storing unit 130a in response to the received command CMD. As illustrated in FIG. 4, the control unit 110a may include a control signal storing unit 111a, a command decoder 112a, a logic unit 113a, and a ROS controller 114a.

The command decoder 112a may decode the received command CMD and generate a control signal in response to the received command CMD. For example, the command decoder 112a may receive a first command and generate a first control signal C1 based on the received first command. In addition, the command decoder 112a may receive a second command and generate a second control signal C2 based on the received second command. According to an exemplary embodiment of the inventive concept, the control unit 110a may store the first control signal C1, which is output by the command decoder 112a upon reception of the first command, in the control signal storing unit 111a. That is, the stored first control signal C1 may indicate that the control signal storing unit 111a is in a programmed state. For example, the control signal storing unit 111a may include the anti-fuse circuit 10 illustrated in FIG. 2, and the control unit 110a may program the anti-fuse circuit 10 according to the first control signal C1 generated by the command decoder 112a, that is, change the gap between the first node 14 and the second node 15 of the anti-fuse circuit 10 to a closed state.

According to an exemplary embodiment of the inventive concept, the second command, which is received by the control unit 110a (that is, the command decoder 112a), may instruct the semiconductor memory device 100 to perform the reconfiguration operation. The second control signal C2, which is generated by the command decoder 112a in response to the second command, may be used to control the ROS controller 114a. In addition, according to an exemplary embodiment of the inventive concept, the control unit 110a may receive a command instructing an entry into a test mode and enter the test mode accordingly. The command decoder 112a of the control unit 110a may recognize, that is, decode the first and second commands in a state in which the control unit 110a enters the test mode.

The logic unit 113a may be connected to the control signal storing unit 111a and receive the second control signal C2 from the command decoder 112a. The control signal storing unit 111a may transmit, to the logic unit 113a, a signal indicating whether the first control signal is stored, and the logic unit 113a may generate an enable signal EN based on the received signals. In a case where the control signal storing unit 111a stores the first control signal, the logic unit 113a may deactivate the enable signal EN so as to prevent the second control signal C2 from being transmitted to the ROS controller 114a.

The ROS controller 114a may control the reconfiguration operation of the semiconductor memory device 100. For example, the ROS controller 114a may perform control such that the test information is stored in the test information storing unit 130a. As illustrated in FIG. 4, the ROS controller 114a may receive the enable signal EN from the logic unit 113a and control the start of the reconfiguration operation when the enable signal EN is activated.

According to an exemplary embodiment of the inventive concept, the control unit 110a may selectively prevent the execution of the reconfiguration operation of the semiconductor memory device 100 by providing the control signal storing unit 111a and supporting the first command for programming the control signal storing unit 111a. For example, in a case where the control signal storing unit 111a includes the anti-fuse circuit 10 illustrated in FIG. 2, the semiconductor memory device 100 receives the control signal in a final step of the process of manufacturing the semiconductor memory device 100. Therefore, it is possible to prevent the semiconductor memory device 100 from performing the reconfiguration operation due to an unexpected cause while the semiconductor memory device is operated by a user.

Figure 5:
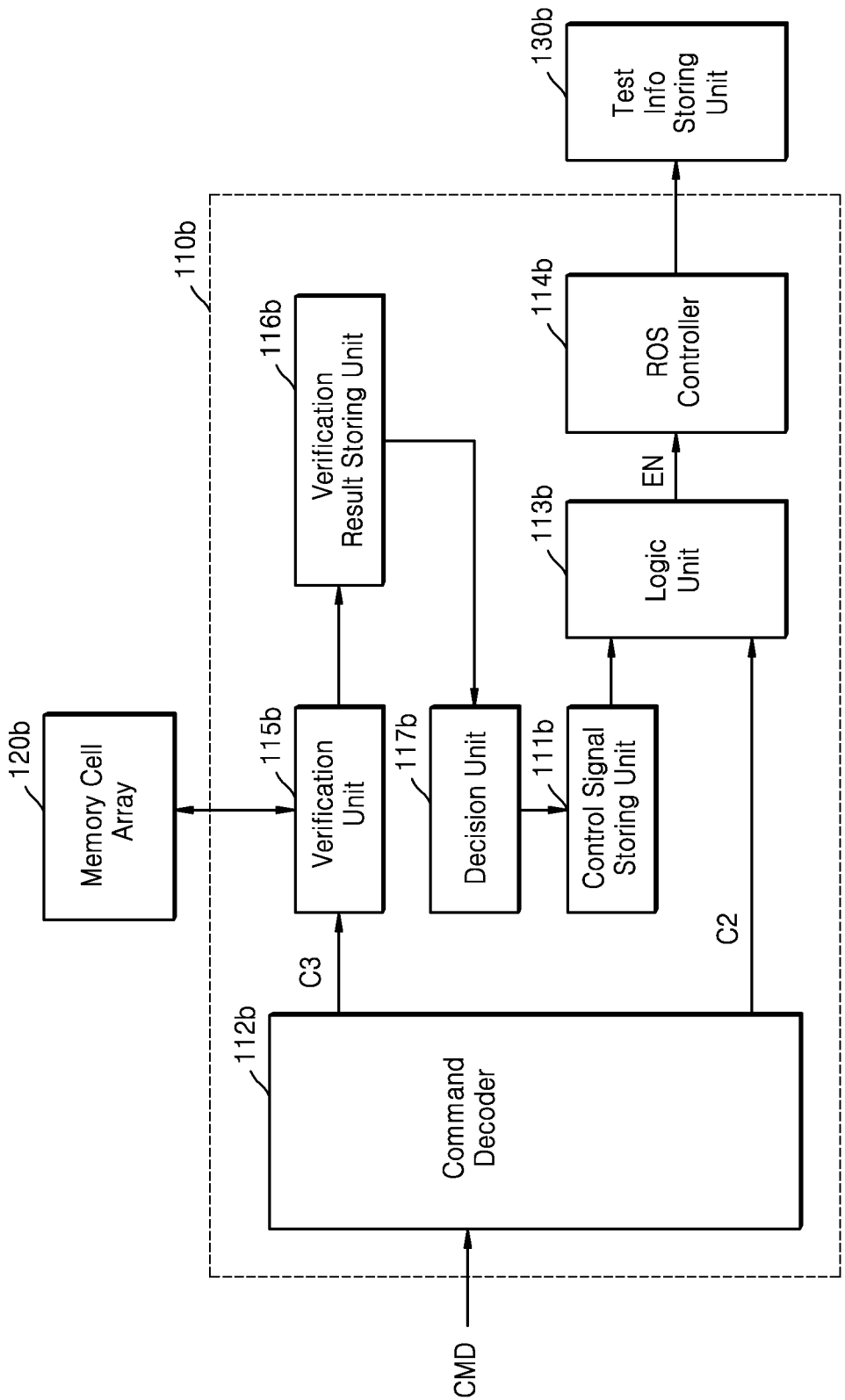
FIG. 5 is a block diagram illustrating an implementation example of the control unit included in the semiconductor memory device of FIG. 1, according to an exemplary embodiment of the inventive concept.

FIG. 5 is a block diagram illustrating an implementation example 110b of the control unit 110 included in the semiconductor memory device 100 of FIG. 1, according to an exemplary embodiment of the inventive concept. As in the implementation example 110a of FIG. 4, the control unit 110b of FIG. 5 may receive a command CMD from a memory controller or the like and program a test information storing unit 130b in response to the received command CMD. As illustrated in FIG. 5, the control unit 110b may include a control signal storing unit 111b, a command decoder 112b, a logic unit 113b, a ROS controller 114b, a verification unit 115b, a verification result storing unit 116b, and a decision unit 117b. According to an exemplary embodiment of the inventive concept, the control unit 110b of FIG. 5 may store a control signal in the control signal storing unit 111b in a different method from the control unit 110a of FIG. 4. Since the functions of the logic unit 113b and the ROS controller 114b are similar to those of the exemplary embodiment of FIG. 4, a description of the logic unit 113b and the ROS controller 114b will be omitted.

The command decoder 112b may receive a second command and then generate a second control signal C2 based on the received second command. In addition, the command decoder 112b may receive a third command and generate a third control signal C3 based on the received third command. As in the exemplary embodiment of FIG. 4, the second command may instruct the semiconductor memory device 100 to perform the reconfiguration operation, and the second control signal C2, which is generated by the command decoder 112b in response to the second command, may be used to control the ROS controller 114b. According to an exemplary embodiment of the inventive concept, the third command, which is received by the control unit 110b (that is, the command decoder 112b), may instruct the semiconductor memory device 100 to perform a verification operation. The third control signal C3, which is generated by the command decoder 112b in response to the second command, may be transmitted to the verification unit 115b.

In addition, according to an exemplary embodiment of the inventive concept, the control unit 110b may receive a command instructing an entry into a test mode and enter the test mode accordingly. The command decoder 112b of the control unit 110b may recognize, that is, decode the first, second, and third commands in a state in which the control unit 110b enters the test mode.

The verification unit 115b may perform the operation of verifying the memory cell array 120b. For example, the verification unit 115b may include at least one comparator, and the comparator may compare data received from the outside of the semiconductor memory device 100 with data read from the memory cell array 120b. A test system for testing the semiconductor memory device 100, such as the test system 2000 of FIG. 2, may transmit a command instructing the writing of the first data to the semiconductor memory device 100 and transmits the third command. Then, the test system for testing the semiconductor memory device 100 may provide the first data to the semiconductor memory device 100, and the comparator included in the verification unit 115b may compare the data read from the memory cell array 120b with the first data provided from the test system. When the data read from the memory cell array 120b is identical to the first data, the verification unit 115b may determine that the verification of the memory cell array 120b is passed. On the other hand, when the data read from the memory cell array 120b is different from the first data, the verification unit 115b may determine that the verification of the memory cell array 120b failed and generate a signal corresponding to the determination result. At this time, the verification unit 115b may additionally generate information on a region of the memory cell array, of which the verification failed, that is, an address signal.

According to an exemplary embodiment of the inventive concept, the semiconductor memory device 100 may store a control signal in the control signal storing unit 111b, based on the verification result of the verification unit 115b. The third command may instruct a relatively simple verification operation, and the verification unit 115b may perform the verification operation in response to the third command (that is, the third control signal C3 generated by the third command) Therefore, by selectively storing the control signal in the control signal storing unit 111b based on the verification result, the semiconductor memory device 100 may perform the reconfiguration operation in response to the second command only when passing the simple verification. Like the DUTs 1001, 1002, and 1003 of FIG. 2, the semiconductor memory device 100, of which the reconfiguration operation needs to be prevented due to a contact failure or the like, may be determined when the verification performed by the verification unit 115b in response to the third command failed. The subsequent reconfiguration operation in response to the second command may be prevented in the semiconductor memory device 100, such as the DUTs 1001, 1002, and 1003 of FIG. 2. According to an exemplary embodiment of the inventive concept, in a case where the control signal storing unit 111b includes non-volatile memory cells, the semiconductor memory device 100, of which the reconfiguration operation has been prevented, may be tested again after the problem such as the contact failure is solved.

The verification result storing unit 116b may store the signal that is generated according to the verification result by the verification unit 115b. For example, when the verification unit 115b determines that the verification failed and generates a signal corresponding to the determination result, the verification result storing unit 116b may store the generated signal. The verification unit 115b may perform the verification operation twice or more, and the verification result storing unit 116b may store signals corresponding to a plurality of determination results of the verification unit 115b.

The decision unit 117b may decide whether to store the control signal in the control signal storing unit 111b, that is, whether to program the control signal storing unit 111b, based on one or more verification results stored in the verification result storing unit 116b. For example, the verification unit 115b may perform the verification operation a preset number of times in response to the third control signal C3, and the verification result storing unit 116b may store the verification results that the verification unit 115b determines as failed. In a case where the number of the verification results, which are determined as failed and are stored in the verification result storing unit 116b, is larger than a reference value, the decision unit 117b may program the control signal storing unit 111b. Alternatively, the plurality of verifications performed by the verification unit 115b may be different types, and the decision unit 117b may decide whether to program the control signal storing unit 111b based on the verification results of the different types of the verifications. For example, the verification unit 115b may perform first, second, and third verifications, and the decision unit 117b may program the control signal storing unit 111b when the first verification failed or when both the second and third verifications failed.

According to an exemplary example of the inventive concept, the verification unit 115b may be used in the reconfiguration operation. That is, the verification unit 115b may be used to determine a defect contained in the memory cell array 120b. When the defect is detected, the verification unit 115b may generate an address signal for a region containing the defect. The ROS controller 114b may program the test information storing unit 130b based on the address signal generated by the verification unit 115b. Therefore, the region containing the defect may be replaced with another region of the memory cell array 120b. The address signal generated by the verification unit 115b may be stored in a fail address memory (FAM) as a temporary storage space, and the ROS controller 114b may access the FAM. According to an exemplary example of the inventive concept, the verification result storing unit 116b may be a FAM. That is, the control unit 110b may use the FAM as the verification result storing unit 116b that is used for determining whether to store the control signal in the control signal storing unit 111b.

According to an exemplary embodiment of the inventive concept, the single semiconductor memory device 100 illustrated in FIG. 1 may include the implementation examples 110a and 110b of the control unit 110 illustrated in FIGS. 4 and 5. That is, the control unit 110 illustrated in FIG. 1 may receive the first, second, and third commands and generate the first, second, and third control signals C1, C2, and C3 in response to the first, second, and third commands. The control unit 110 may store the control signals in the control signal storing unit 111 in response to the first command, or may verify the memory cell array 120b in response to the third command and store the control signals in the control signal storing unit 111 based on the verification result. The control unit 110 may prevent the reconfiguration operation in response to the reception of the second command according to whether the control signal is stored in the control signal storing unit 111.

Figure 6:
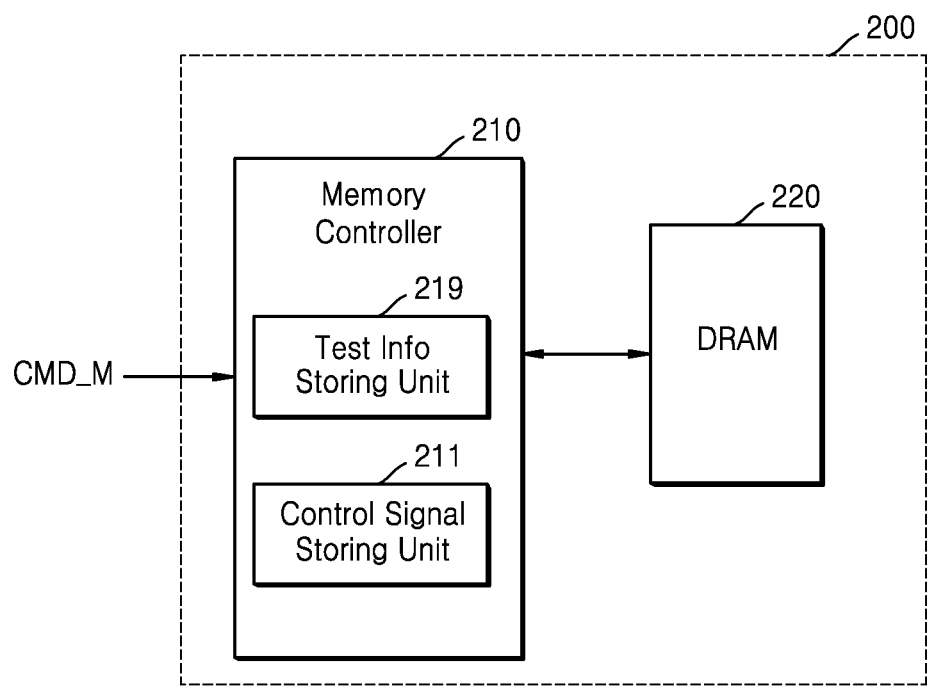
FIG. 6 is a block diagram of a memory module according to an exemplary embodiment of the inventive concept.

FIG. 6 is a block diagram of a memory module 200 according to an exemplary embodiment of the inventive concept. The memory module 200 may be used as a main memory of a computing system and may include at least one semiconductor memory device. In FIG. 6, the memory module 200 is illustrated as including a DRAM device 220, but the memory module 200 according to the inventive concept is not limited thereto. As illustrated in FIG. 6, the memory module 200 may include a memory controller 210 and a DRAM device 220. The memory controller 210 may receive a command CMD_M from an external device (for example, a main memory controller) of the memory module 200 and control the memory module 200 in response to the received command CMD_M. Although not illustrated, the memory controller 210 may receive an address and data from the external device of the memory module 200 and transmit data stored in the DRAM device 220 to the external device.

According to an exemplary embodiment of the inventive concept, the memory controller 210 may include a control signal storing unit 211 and a test information storing unit 219. The control signal storing unit 211 and the test information storing unit 219 may operate similarly to the control signal storing unit 111 and the test information storing unit 130 included in the semiconductor memory device 100 of FIG. 1.

The test information storing unit 219 may store test information based on the test result of the memory module 200. As in the semiconductor memory device 100, the process of manufacturing the memory module 200 may include testing the memory module 200 so as to obtain separate characteristics of the memory module 200. Referring to FIG. 3, the memory module 200 may be connected to a test system 2000, and the test system 2000 may test the memory module 200 by transmitting a signal to the memory module 200 or receiving a signal from the memory module 200. The test system 2000 may transmit a command to the memory module 200 so as to store test information in the test information storing unit 219, based on the test result of the memory module 200. The memory module 200 may be controlled to operate in an adjusted or optimized condition based on the test information stored in the test information storing unit 219.

According to an exemplary embodiment of the inventive concept, the test information storing unit 219 may include non-volatile memory cells. For example, the test information storing unit 219 may include rewritable non-volatile memory cells, such as flash memory cells, MRAM cells, RRAM cells, FRAM cells, or PCM cells, or may include OTP type non-volatile memory cells, such as anti-fuse circuits. In the following, the test information storing unit 219 is described as including the anti-fuse circuit, but it will be understood that the inventive concept is not limited thereto.

According to an exemplary embodiment of the inventive concept, the memory controller 210 may selectively perform the operation of programming the test information storing unit 219 in response to the control signal stored in the control signal storing unit 211. That is, the memory controller 210 may prevent the programming of the test information storing unit 219 according to whether the control signal is stored in the control signal storing unit 211. In this manner, the memory module 200 may prevent the programming of the test information storing unit 219 with arbitrary data due to an unintended external input signal, for example, a power noise. The control signal storing unit 211 may include volatile memory cells, such as SRAM cells or DRAM cells, or may include non-volatile memory cells, such as flash memory cells, MRAM cells, RRAM cells, FRAM cells, or PCM cells. In addition, the control signal storing unit 211 may include OTP type memory cells, such as anti-fuses.

Figure 7:
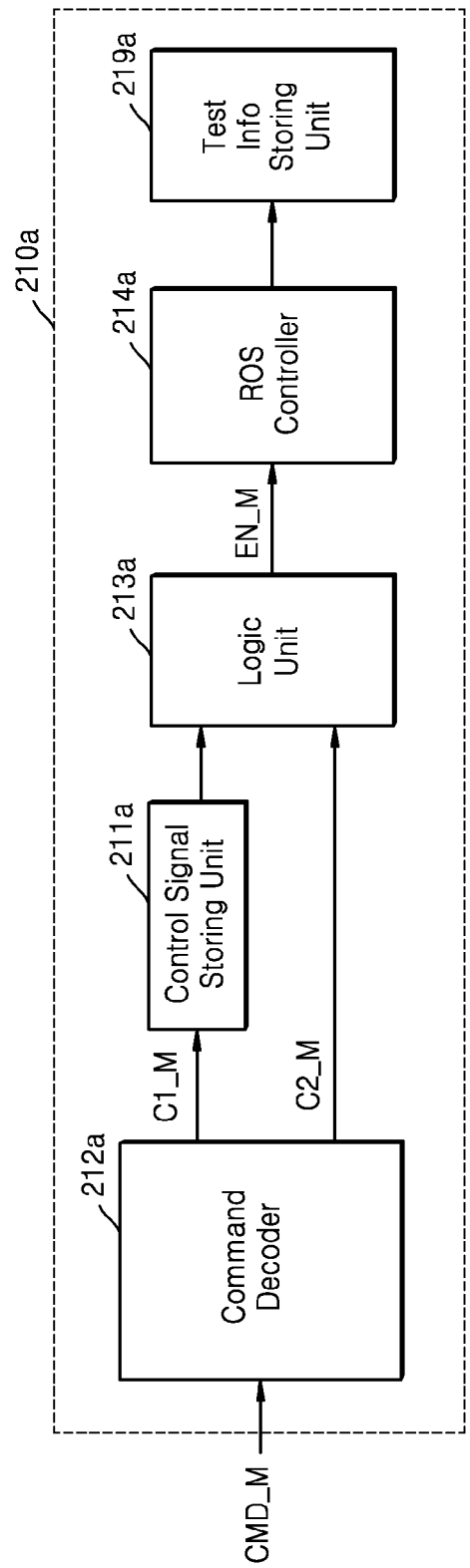
FIG. 7 is a block diagram illustrating an implementation example of the memory controller included in the memory module of FIG. 6, according to an exemplary embodiment of the inventive concept.

FIG. 7 is a block diagram illustrating an implementation example 210a of the memory controller 210 included in the memory module 200 of FIG. 6, according to an exemplary embodiment of the inventive concept. As illustrated in FIG. 7, the memory controller 210a may include a control signal storing unit 211a, a command decoder 212a, a logic unit 213a, and a ROS controller 214a. When compared with the control unit 110a and the test information storing unit 130a included in the semiconductor memory device 100 of FIG. 4, the respective elements of FIG. 7 may perform similar operations to the respective elements of FIG. 4. On the other hand, the test information storing unit 219a may store test information based on the test result of the DRAM device 220 of FIG. 6.

The command CMD_M, which is received by the command decoder 212a of the memory controller 210a, may include a first command or a second command. The first and second commands may instruct the memory module 200 to perform similar operations to those instructed by the first and second commands received by the control unit 110a of FIG. 4. The command decoder 212a may generate a first control signal C1_M and a second control signal C2_M, respectively, in response to the received first and second commands. The logic unit 213a may generates an enable signal EN_M according to the signal received from the control signal storing unit 211a and the second control signal C2_M and transmit the generated enable signal EN_M to the ROS controller 214a. The ROS controller 214a may control the start of the reconfiguration operation in response to the enable signal EN_M. The operations of the other elements of the memory controller 210a may be similar to those of the corresponding elements of the control unit 110a of FIG. 4.

In addition, according to an exemplary embodiment of the inventive concept, the memory controller 210a may receive a command instructing an entry into a test mode and enter the test mode accordingly. The command decoder 212a of the memory controller 210a may recognize, that is, decode the first and second commands in a state in which the memory controller 210a enters the test mode.

Figure 8:
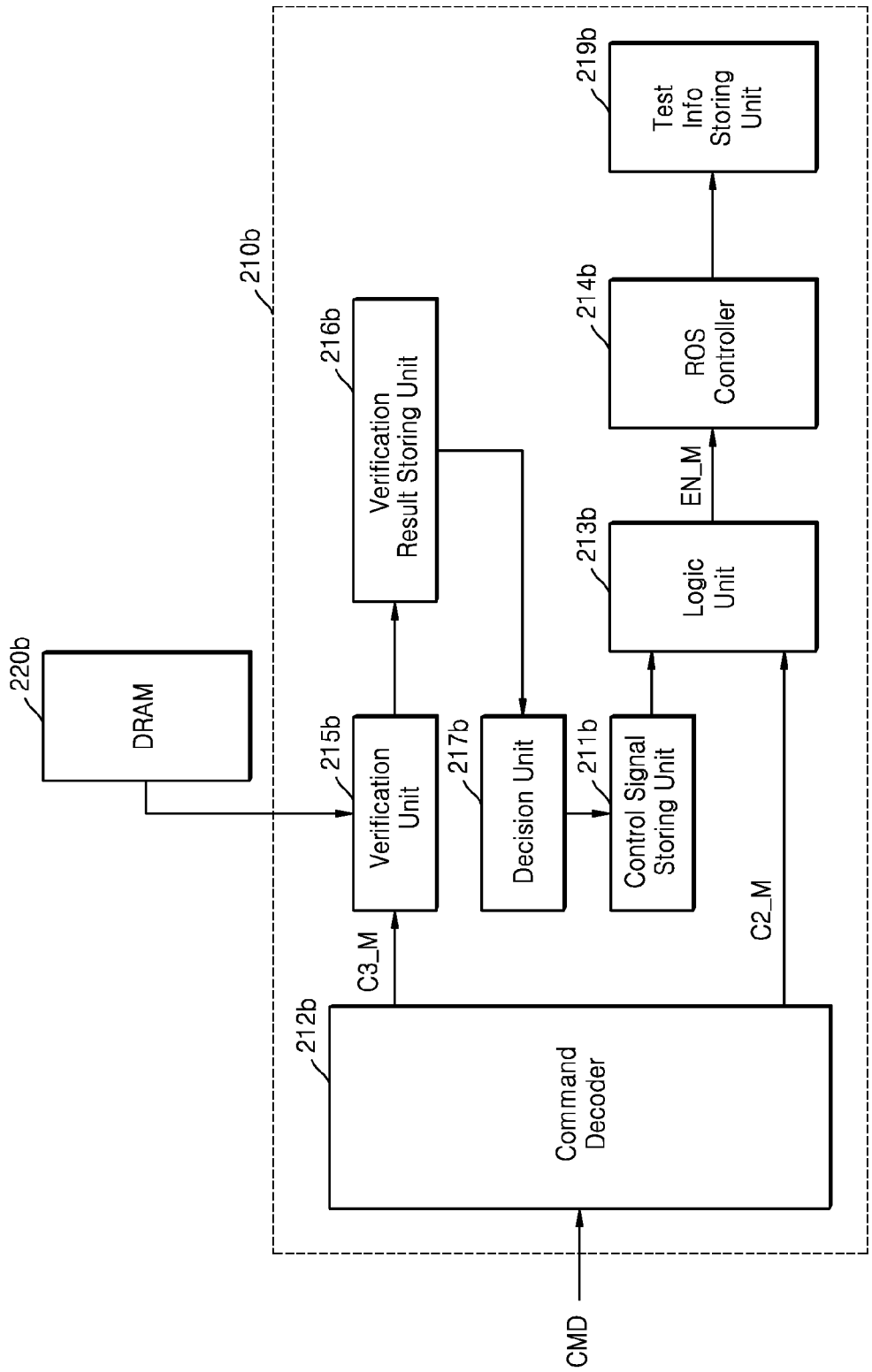
FIG. 8 is a block diagram illustrating an implementation example of the memory controller included in the memory module of FIG. 6, according to an exemplary embodiment of the inventive concept.

FIG. 8 is a block diagram illustrating an implementation example 210b of the memory controller 210 included in the memory module 200 of FIG. 6, according to an exemplary embodiment of the inventive concept. As in the implementation example 210a of FIG. 5, the memory controller 210b of FIG. 8 may receive a command CMD_M from an external device of the memory module. As illustrated in FIG. 8, the memory controller 210b may include a control signal storing unit 211b, a command decoder 212b, a logic unit 213b, a ROS controller 214b, a verification unit 215b, a verification result storing unit 216b, a decision unit 217b, and a test information storing unit 219b. When compared with the control unit 110b and the test information storing unit 130b included in the semiconductor memory device 100 of FIG. 5, the respective elements of FIG. 8 may perform similar operations to the respective elements of FIG. 5. On the other hand, the verification unit 215b may verify the DRAM device 220b and the test information storing unit 219b may store test information based on the test result of the DRAM device 220b of FIG. 216.

The command CMD_M, which is received by the command decoder 212b of the memory controller 210b, may include a second command or a third command. The second and third commands may instruct the memory module 200 to perform similar operations to those instructed by the second and third commands received by the control unit 110b of FIG. 5. The command decoder 212b may generate a second control signal C2_M and a third control signal C3_M, respectively, in response to the received second and third commands. The logic unit 213b may generate an enable signal EN_M according to the signal received from the control signal storing unit 211b and the second control signal C2_M and transmit the generated enable signal EN_M to the ROS controller 214b. The ROS controller 214b may control the start of the reconfiguration operation in response to the enable signal EN_M.

In addition, according to an exemplary embodiment of the inventive concept, the memory controller 210b may receive a command instructing an entry into a test mode and enter the test mode accordingly. The command decoder 212b of the memory controller 210b may recognize, that is, decode the first, second, and third commands in a state in which the memory controller 210b enters the test mode.

The verification unit 215b may generate a third control signal C3_M from the command decoder 212b and verify the DRAM device 220b in response to the third control signal C3_M. For example, the verification unit 215b may transmit a command instructing writing of second data to the DRAM device 220b and may transmit a command instructing reading of the second data. Then, the verification unit 215b may compare data read from the DRAM device 220b with the second data. Then, when the data read from the DRAM device 220b is identical to the second data, the verification unit 215b may determine that the verification of the DRAM device 220b passed. On the other hand, when the data read from the DRAM device 220b is different from the second data, the verification unit 215b may determine that the verification of the DRAM device 220b failed and generate a signal corresponding to the determination result. At this time, the verification unit 215b may additionally generate information on a region of the DRAM device 220b, of which the verification failed, that is, an address signal. In addition, when the memory module 200 includes a plurality of DRAM devices, the verification unit 215b may generate a signal corresponding to identification information of DRAM devices, of which the verification failed, among the plurality of DRAM devices.

The operations of the other elements of the memory controller 210b may be similar to those of the corresponding elements of the control unit 110b of FIG. 5.

According to an exemplary embodiment of the inventive concept, the single memory module 200 illustrated in FIG. 6 may include the implementation examples 210a and 210b of the memory controller 210 as illustrated in FIGS. 7 and 8. That is, the memory controller 210 of FIG. 6 may receive the first, second, and third commands and generate the first, second, and third control signals C1_M, C2_M, and C3_M in response to the first, second, and third commands. The memory controller 210 may store the control signals in the control signal storing unit 211 in response to the first command, or may verify the DRAM device 220 in response to the third command and store the control signals in the control signal storing unit 211 based on the verification result. The memory controller 210 may prevent the reconfiguration operation in response to the reception of the second command according to whether the control signal is stored in the control signal storing unit 211.

Figure 9:
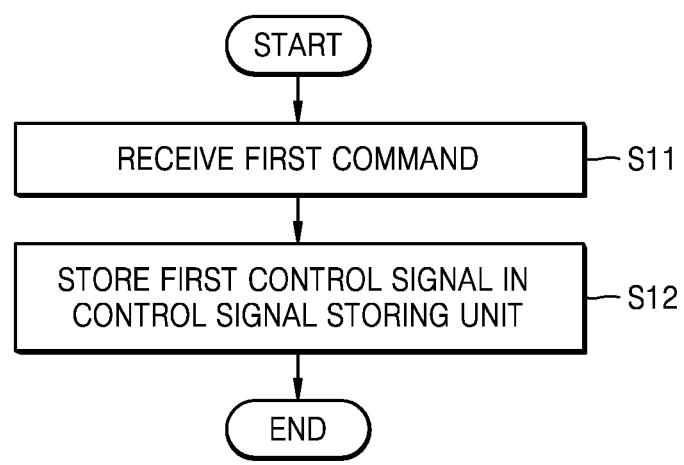
FIGS. 9 and 10 are flowcharts of methods of controlling a control signal storing unit, according to exemplary embodiments of the inventive concept.
Figure 10:
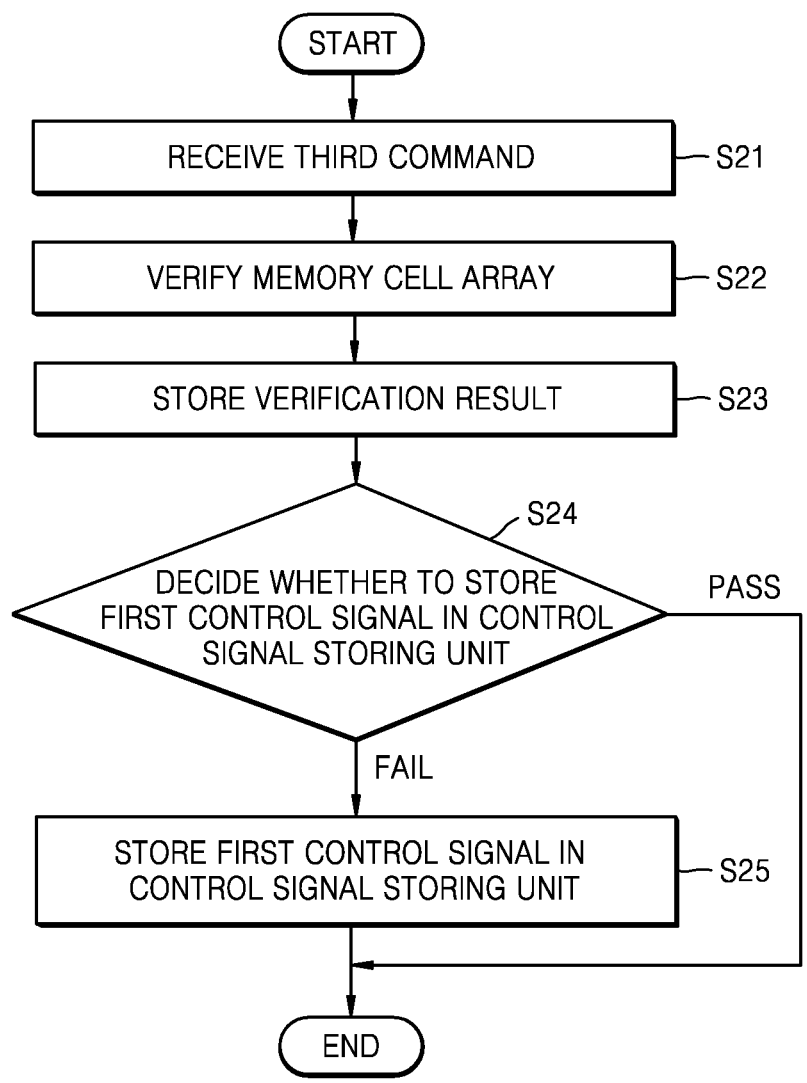

FIGS. 9 and 10 are flowcharts of methods of controlling a control signal storing unit, according to exemplary embodiments of the inventive concept. In FIGS. 9 and 10, the control signal storing unit may be one of the control signal storing units 111a and 111b included in the control units 110a and 110b of the semiconductor memory device 100 illustrated in FIGS. 4 and 5, or may be one of the control signal storing units 211a and 211b included in the memory controllers 210a and 210b of the memory module 200 illustrated in FIGS. 7 and 8. In the following, a method of controlling a control signal storing unit according to an exemplary embodiment of the inventive concept will be described with reference to the control units 110a and 110b according to the exemplary embodiments illustrated in FIGS. 1 to 5, but it will be understood that the inventive concept is not limited thereto.

Referring to FIGS. 4 and 9, in operation S11, the control unit 110a may receive a first command. In operation S12, the control unit 110a may store a control signal in the control signal storing unit 111a in response to the received first command. For example, according to an exemplary embodiment of the inventive concept, when the control signal storing unit 111a includes the anti-fuse circuit of FIG. 2, the control unit 110a may program the anti-fuse circuit upon reception of the first command By transmitting the first command to the semiconductor memory device 100, the test system for testing the semiconductor memory device 100, such as the test system 2000 of FIG. 2, is capable of preventing the semiconductor memory device 100 from performing the reconfiguration operation due to an unexpected external input signal. For example, the test system is capable of preventing the test information storing unit 130a from being programmed with arbitrary data.

Referring to FIGS. 5 and 10, in operation S21, the control unit 110b may receive a third command. In operation S22, the verification unit 115b included in the control unit 110b may verify the memory cell array 120b according to a third control signal C3 generated in response to the third command received by the command decoder 112b. In operation S23, the verification result storing unit 116b may store verification result of the verification unit 115b. For example, the verification unit 115b may verify the memory cell array 120b twice or more, and the verification result storing unit 116b may store a plurality of verification results.

In operation S24, the decision unit 117b may decide whether to store the control signal in the control signal storing unit 111b based on the verification result stored in the verification result storing unit 116b. For example, in operation S25, the decision unit 117b may store the control signal in the control signal storing unit 111b, that is, program the control signal storing unit 111b, when the number of the verification results, which correspond to the verification failure and are stored in the verification result storing unit 116b, is larger than a reference value.

Figure 11:
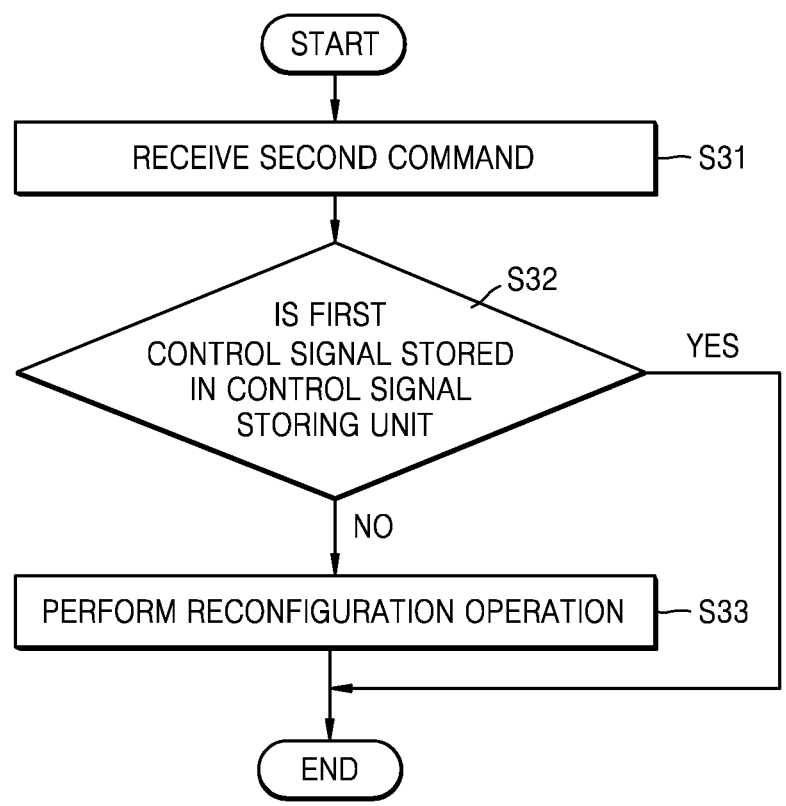
FIG. 11 is a flowchart of a method of performing a reconfiguration operation, according to an exemplary embodiment of the inventive concept.

FIG. 11 is a flowchart of a method of performing a reconfiguration operation, according to an exemplary embodiment of the inventive concept. In FIG. 11, the reconfiguration operation may be controlled by one selected from among the ROS controllers 114a, 114b, 214a, and 214b illustrated in the preceding drawings. In the following, the method of performing the reconfiguration operation according to the exemplary embodiment of the inventive concept will be described with reference to the control unit 110a illustrated in FIG. 4, but it will be understood that the inventive concept is not limited thereto.

Referring to FIGS. 4 and 11, in operation S31, the control unit 110a may receive a second command. In operation S32, the control unit 110a may determine whether the first control signal is stored in the control signal storing unit 111a. For example, the logic unit 113a may receive a signal from the control signal storing unit 111a and receive a second control signal C2 generated by the command decoder 112a in response to the second command. In a case where the signal received from the control signal storing unit 111a stores the first control signal, the logic unit 113a may deactivate an enable signal EN so as to prevent the second control signal C2 from being transmitted to the ROS controller 114a. On the other hand, in a case where the signal received from the control signal storing unit 111a does not store the first control signal, the logic unit 113a may activate the enable signal EN in response to the second control signal. In operation S33, the ROS controller 114a may control the reconfiguration operation so that the control unit 110a performs the reconfiguration operation.

Figure 12:
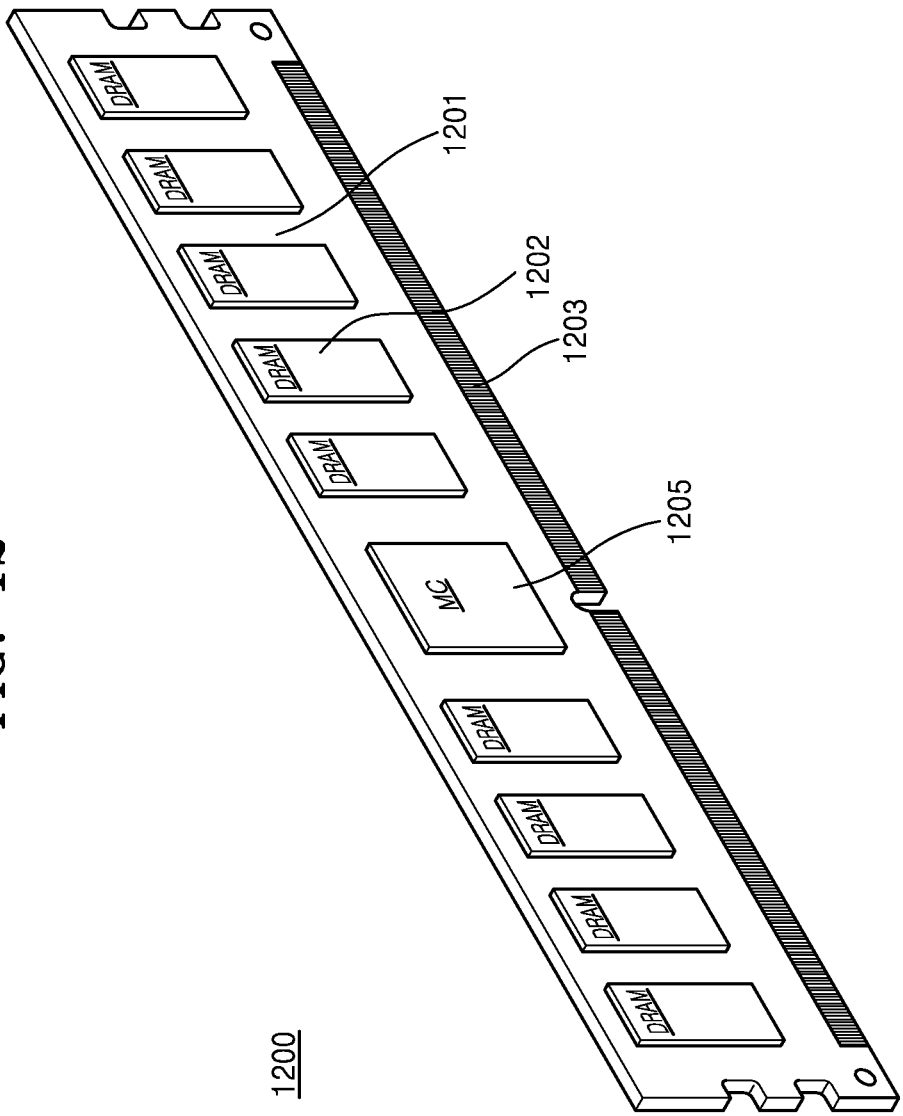
FIG. 12 is a perspective view of a semiconductor memory device according to an exemplary embodiment of the inventive concept or a memory module according to an exemplary embodiment of the inventive concept.

FIG. 12 is a perspective view of a module including a semiconductor memory device according to an exemplary embodiment of the inventive concept or a memory module according to an exemplary embodiment of the inventive concept. According to an exemplary embodiment of the inventive concept, the memory module 1200 may include a printed circuit board 1201, a plurality of DRAM chips 1202, a connector 1203, and a memory controller 1205. The memory controller 1205 may control operation modes of the DRAM chips 1202 and may control various functions, characteristics, and modes by using mode registers of the DRAM chips 1202. Each of the DRAM chips 1202 may support a DDR mode and include a plurality of data input terminals through which data is input or output according to the DDR mode.

The DRAM chip 1202 may be the semiconductor memory device according to the exemplary embodiment of the inventive concept. For example, the DRAM chip 1202 may be the semiconductor memory device 100 including the control unit 110a or 110b illustrated in FIG. 4 or 5. Therefore, the DRAM chip 1202 may include the control signal storing unit and selectively perform the reconfiguration operation according to the control signal stored in the control signal storing unit.

The memory module 1200 may be the memory module according to the exemplary embodiment of the inventive concept. For example, the memory controller 1205, which is connected to the DRAM chips 1202, may be the memory controller 210a or 210b illustrated in FIG. 7 or 8. Therefore, the memory controller 1205 may include the control signal storing unit and selectively perform the reconfiguration operation according to the control signal stored in the control signal storing unit.

The memory module 1200 may be configured in a type selected from among a single in-line memory module (SIMM), a dual in-line memory module (DIMM), a small-outline DIMM (SO_SIMM), an unbuffered DIMM (UDIMM), a fully-buffered DIMM (FBDIMM), a rank-buffered DIMM (RBDIMM), a load-reduced DIMM (LRDIMM), a mini-DIMM, and a micro-DIMM.

Figure 13:
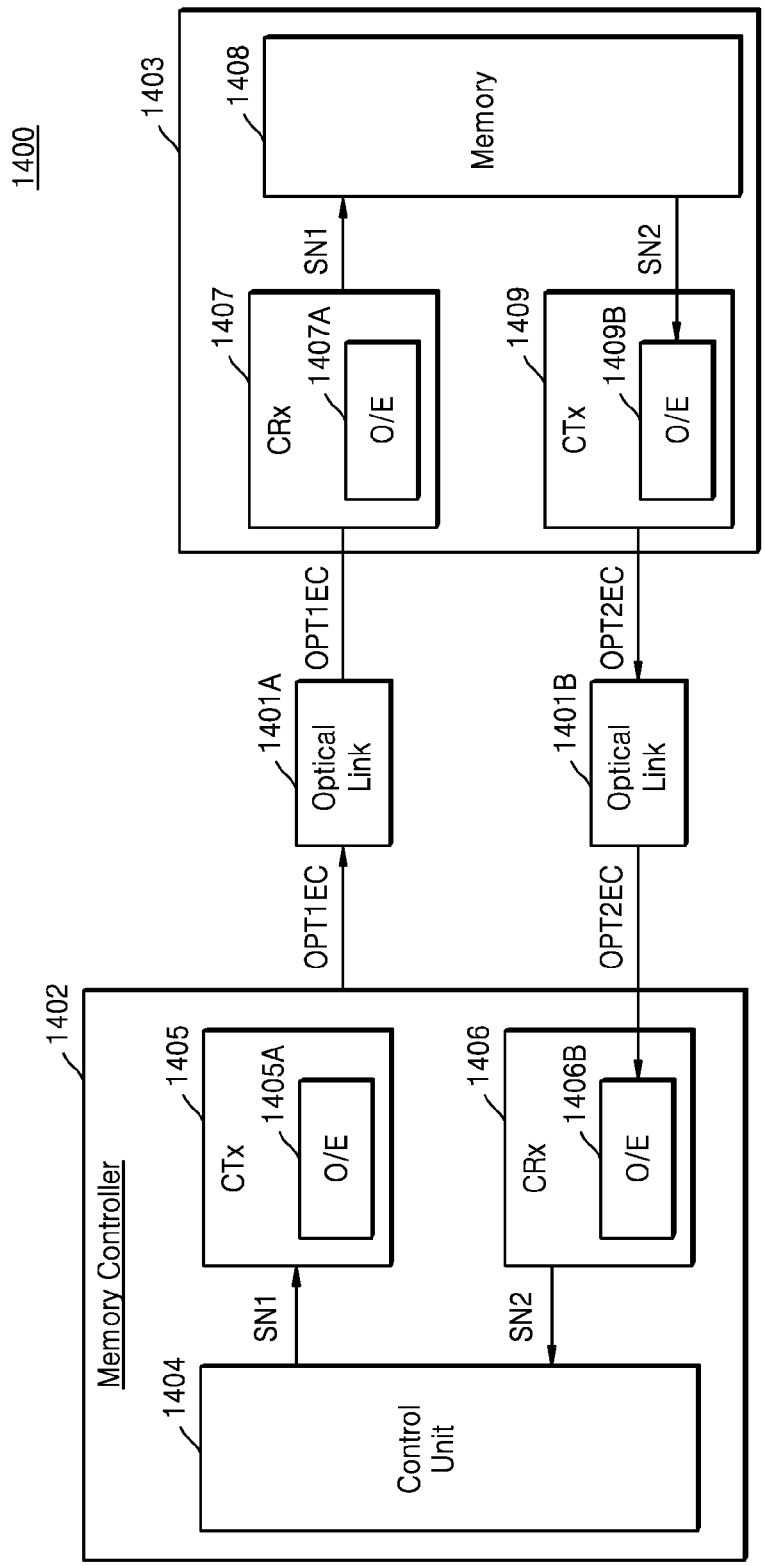
FIG. 13 is a block diagram of a memory device or a memory system including a memory controller, according to an exemplary embodiment of the inventive concept.

FIG. 13 is a block diagram of a memory device or a memory system including a memory controller, according to an exemplary embodiment of the inventive concept. As illustrated in FIG. 13, the memory system 1400 may include optical link devices 1401A and 1401B, a memory controller 1402, and a DRAM 1403. The optical link devices 1401A and 1401B may connect the memory controller 1402 to the DRAM 1403. The memory controller 1402 may include a control unit 1404, a first transmission unit 1405, and a first reception unit 1406. The control unit 1404 may transmit a first electrical signal SN1 to the first transmission unit 1405. The first electrical signal SN1 may include command signals, clocking signals, address signals, or write data, which are transmitted to the DRAM 1403.

The first transmission unit 1405 may include a first optical modulator 1405A, and the first optical modulator 1405A may convert the first electrical signal SN1 into a first optical transmission signal OPT1EC and transmit the first optical transmission signal OPT1EC to the optical link device 1401A. The first optical transmission signal OPT1EC may be transmitted through the optical link device 1401A by serial communication. The first reception unit 1406 may include a first optical demodulator 1406B, and the first optical demodulator 1406B may convert a second optical reception signal OPT2EC received from the optical link device 1401B into a second electrical signal SN2 and transmit the second electrical signal SN2 to the control unit 1404. The second electrical signal SN2 may include a data signal DQ and a data strobe signal DQS. The memory controller 1402 may be one of the memory controllers according to the exemplary embodiments of the inventive concept. For example, the memory controller 1402 may be the memory controller 210a or 210b illustrated in FIG. 7 or 8. Therefore, the memory controller 1402 may include the control signal storing unit and selectively perform the reconfiguration operation according to the control signal stored in the control signal storing unit.

The DRAM 1403 may include a second reception unit 1407, a memory area 1408 including a memory cell array, and a second transmission unit 1409. The second reception unit 1407 may include a second optical demodulator 1407A, and the second optical demodulator 1407A may convert the first optical reception signal OPT1EC received from the optical link device 1401A into the first electrical signal SN1 and transmit the first electrical signal SN1 to the memory area 1408.

In the memory area 1408, write data may be written to the memory cell in response to the first electrical signal SN1, or data read from the memory area 1408 may be transmitted to the second transmission unit 1409 as the second electrical signal SN2. The first electrical signal SN1 may include a signal corresponding to an input data sequence DQ and a data strobe signal DQS. The memory area 1408 may include the control unit according to the exemplary embodiment of the inventive concept. For example, the memory area 1408 may include the control unit 110a or 110b illustrated in FIG. 4 or 5. Therefore, the control unit included in the memory area 1408 may include the control signal storing unit and selectively perform the reconfiguration operation according to the control signal stored in the control signal storing unit.

The second electrical signal SN2 may include a clocking signal and read data, which are transmitted to the memory controller 1402. The second transmission unit 1409 may include a second optical modulator 1409B, and the second optical modulator 1409B may convert the second electrical signal SN2 into the second optical transmission signal OPT2EC and transmit the second optical transmission signal OPT2EC to the optical link device 1401B. The second optical transmission signal OPT2EC may be transmitted through the optical link device 1401B by serial communication.

Figure 14:
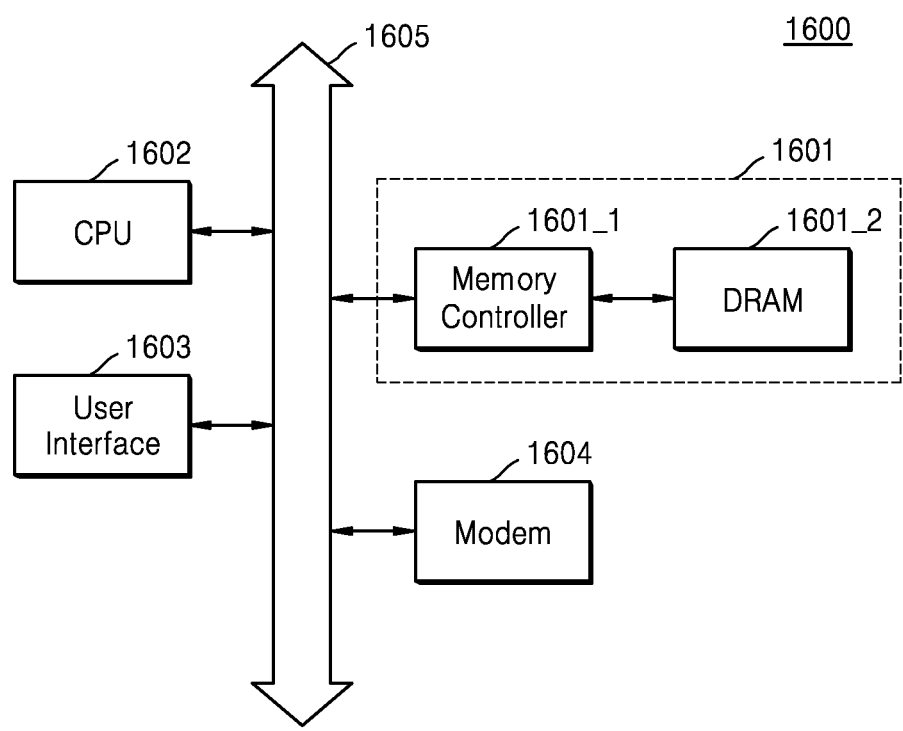
FIG. 14 is a block diagram of a computer system including a memory controller or a dynamic random-access memory (DRAM), according to an exemplary embodiment of the inventive concept.

FIG. 14 is a block diagram of a computer system 1600 including a memory controller 1601_1 or a DRAM 1601_2, according to an exemplary embodiment of the inventive concept. The computer system 1600 may be mounted on a mobile device or a desktop computer. The computer system 1600 may include a DRAM memory system 1601 electrically connected to a system bus 1605, a central processing unit (CPU) 1602, a user interface 1603, and a modem 1604 such as a baseband chipset. The computer system 1600 may further include an application chipset, a camera image processor, and an input/output device.

The user interface 1603 may be an interface that transmits data to a communication network or receives data from the communication network. The user interface 1603 may be a wired/wireless type user interface 1603 or may include an antenna or a wired/wireless transceiver. The user interface 1603 may store data provided through the modem 1604 or data processed by the CPU 1602 in the DRAM memory system 1601.

The DRAM memory system 1601 may include a DRAM 1601_2 and a memory controller 1601_1. The DRAM 1601_2 may store data processed by the CPU 1602 or data input from the outside. The DRAM 1601_2 may be one of the semiconductor memory devices according to the exemplary embodiments of the inventive concept. Therefore, the DRAM 1601_2 may include the control signal storing unit and selectively perform the reconfiguration operation according to the control signal stored in the control signal storing unit.

The memory controller 1601_1 may be one of the memory controllers according to the exemplary embodiments of the inventive concept. In addition, the DRAM memory system 1601 may be one of the memory modules according to the exemplary embodiments of the inventive concept. Therefore, the memory controller 1601_1 may include the control signal storing unit and selectively perform the reconfiguration operation according to the control signal stored in the control signal storing unit.

In a case where the computer system 1600 is a system that performs wireless communication, the computer system 1600 may be used in a communication system, such as Code Division Multiple Access (CDMA), Global System for Mobile Communication (GSM), North American Digital Cellular (NADC), and CDMA2000. The computer system 1600 may be mounted on an information processing device, such as a personal digital assistant (PDA), a portable computer, a web tablet, a digital camera, a portable media player (PMP), a mobile phone, a wireless phone, and a laptop computer.

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
    a memory cell array including a plurality of memory cells;
    a test information storing unit configured to store test information in a non-volatile manner, wherein the test information is based on test results of the plurality of memory cells; and
    a control unit including a control signal storing unit, wherein the control unit is configured to prevent programming of the test information in the test information storing unit based on a control signal stored in the control signal storing unit.

2. The semiconductor memory device of claim 1, wherein the control unit is configured to generate a first control signal upon reception of a first command, store the first control signal in the control signal storing unit, and prevent the programming of the test information storing unit according to the stored first control signal upon reception of a second command.

3. The semiconductor memory device of claim 2, wherein the control signal storing unit includes a one time programmable (OTP) device, and the stored first control signal corresponds to a state in which the OTP device is programmed.

4. The semiconductor memory device of claim 2, wherein the control unit further comprises:
    a verification unit configured to verify data stored in the memory cell array upon reception of a third command;
    a verification result storing unit configured to store verification results of the verification unit; and
    a decision unit configured to decide whether to store the first control signal in the control signal storing unit based on at least one verification result stored in the verification result storing unit.

5. The semiconductor memory device of claim 4, wherein the decision unit is configured to store the first control signal in the control signal storing unit when a number of results corresponding to a failure among the at least one verification result is larger than a reference value.

6. The semiconductor memory device of claim 4, wherein the verification result storing unit includes a fail address memory configured to store an address corresponding to a defect contained in the memory cell array.

7. The semiconductor memory device of claim 2, wherein the control unit is configured to receive a command instructing an entry into a test mode and recognize the first and second commands in the test mode.

8. The semiconductor memory device of claim 1, wherein the test information storing unit includes an anti-fuse circuit.

9. The semiconductor memory device of claim 1, wherein the test information storing unit is configured to store information for replacing a defect contained in the memory cell array.

10. The semiconductor memory device of claim 1, wherein the test information storing unit is configured to store operation characteristic information of the semiconductor memory device, and the operation characteristic information includes at least one of timing information and voltage level information.

11. A memory module comprising:
    at least one semiconductor memory device; and
    a memory controller including a control signal storing unit and a test information storing unit, wherein the memory controller configured to store test information in a non-volatile manner, the test information based on a test result of the at least one semiconductor memory device, wherein the memory controller is configured to prevent programming of the test information in the test information storing unit based on a control signal stored in the control signal storing unit.

12. The memory module of claim 11, wherein the memory controller is configured to store a first control signal upon reception of a first command, store the first control signal in the control signal storing unit, and prevent programming of the test information storing unit according to the stored first control signal upon reception of a second command.

13. The memory module of claim 12, wherein the control signal storing unit includes an OTP device, and the stored first control signal corresponds to a state in which the OTP device is programmed.

14. The memory module of claim 12, wherein the memory controller further includes:
 a verification unit configured to verify data stored in the semiconductor memory device upon reception of a third command;
 a verification result storing unit configured to store verification results of the verification unit; and
 a decision unit configured to decide whether to store the first control signal in the control signal storing unit based on at least one verification result stored in the verification result storing unit.

15. The memory module of claim 14, wherein the verification result storing unit includes a fail address memory configured to store an address corresponding to a defect contained in the semiconductor memory device.

16. A method of operating a semiconductor memory device having a memory cell array including a plurality of memory cells, the method comprising:

storing test information in a test information storing unit in a non-volatile manner, wherein the test information is based on test results of the plurality of memory cells; and controlling the semiconductor memory device by preventing programming of the test information in the test information storing unit based on a control signal stored in a control signal storing unit.

17. The method of claim 16, wherein controlling includes generating a first control signal upon a first command, storing the first control signal in the control signal storing unit, and preventing the programming of the test information storing unit according to the stored first control signal based upon a second command.

18. The method of claim 17, wherein the control signal storing unit includes a one time programmable (OTP) device, and the stored first control signal corresponds to a state in which the OTP device is programmed.

19. The method of claim 17, wherein controlling further comprises:
 verifying data stored in the memory cell array based upon a third command;
 storing verification results; and
 determining whether to store the first control signal in the control signal storing unit based on at least one stored verification result.

20. The method of claim 16, wherein the test information storing unit includes an anti-fuse circuit.

* * * * *